(12) United States Patent
Lee et al.

(10) Patent No.: US 10,049,714 B1
(45) Date of Patent: Aug. 14, 2018

(54) DRAM AND METHOD FOR MANAGING POWER THEREOF

(71) Applicant: NANYA TECHNOLOGY CORPORATION, New Taipei (TW)

(72) Inventors: Chung-Hsun Lee, New Taipei (TW); Hsien-Wen Liu, Luzhu Township, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/654,103

(22) Filed: Jul. 19, 2017

(51) Int. Cl.
*G11C 5/14* (2006.01)
*G11C 11/401* (2006.01)
*G01R 19/25* (2006.01)
*G01R 31/36* (2006.01)
*G06F 1/32* (2006.01)

(52) U.S. Cl.
CPC ........ *G11C 11/401* (2013.01); *G01R 19/2513* (2013.01); *G01R 31/36* (2013.01); *G06F 1/32* (2013.01); *G11C 5/145* (2013.01)

(58) Field of Classification Search
CPC ..... G11C 5/14; G11C 11/401; G11C 11/1697; G11C 11/2297; G11C 13/0038
See application file for complete search history.

(56) References Cited

U.S. PATENT DOCUMENTS

| 7,961,016 | B2 * | 6/2011 | Cheng | H03K 19/0013 |
| | | | | 327/148 |
| 8,817,553 | B2 * | 8/2014 | Yu | G11C 5/145 |
| | | | | 365/189.07 |
| 2003/0146450 | A1 * | 8/2003 | Natori | G11C 5/145 |
| | | | | 257/200 |
| 2008/0117706 | A1 * | 5/2008 | Choi | G11C 5/145 |
| | | | | 365/226 |
| 2008/0247252 | A1 * | 10/2008 | Ruf | G11C 5/14 |
| | | | | 365/211 |
| 2010/0118625 | A1 * | 5/2010 | Matano | G11C 5/145 |
| | | | | 365/189.16 |
| 2013/0063118 | A1 * | 3/2013 | Nguyen | G11C 5/145 |
| | | | | 323/304 |

\* cited by examiner

*Primary Examiner* — Khamdan Alrobaie
(74) *Attorney, Agent, or Firm* — Muncy, Geissler, Olds & Lowe, P.C.

(57) ABSTRACT

The present disclosure provides a DRAM. The DRAM includes a memory array of memory cells, a control device and a charge pump circuit. The control device derives an information associated with a command, and determine, based on the information, whether to provide an amount of electrical energy greater than, less than, or equal to an amount of electrical energy currently required. The charge pump circuit provides the memory array with the resultant amount of electrical energy based on the determination.

8 Claims, 11 Drawing Sheets

DRAM AND METHOD FOR MANAGING POWER THEREOF

TECHNICAL FIELD

The present disclosure relates to a dynamic random access memory (DRAM), and more particularly, to a power management of a DRAM.

DISCUSSION OF THE BACKGROUND

Semiconductor memory devices, for example, dynamic random access memory (DRAM), store data in an array of memory cells. The memory cells are typically arranged in rows and columns. The memory cells in a row are connected together to a word line, and the memory cells in a column are connected together to a bit line. The DRAM also contains many circuits that need more than one voltage for operation. A charge pump is installed into the DRAM, and can be used to generate and stabilize the internal supply voltage of the DRAM from an external voltage supply.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM. The DRAM includes a memory array of memory cells, a control device and a charge pump circuit. The control device derives an information associated with a command, and determine, based on the information, whether to provide an amount of electrical energy greater than, less than, or equal to an amount of electrical energy currently required. The charge pump circuit provides the memory array with the resultant amount of electrical energy based on the determination.

In some embodiments, the control device is further configured to derive the information associated with the command by analyzing a type of the command, and the charge pump circuit provides a same amount of electrical energy as an amount of electrical energy currently provided when the analysis indicates that the type of the command is not different from a type of a command currently executed.

In some embodiments, the charge pump circuit includes a plurality of charge pumps. The control device keeps the quantity of enabled charge pumps among the charge pumps the same as that currently required, and the enabled charge pumps provides the same amount of electrical energy as the amount of electrical energy currently provided.

In some embodiments, the control device is further configured to derive the information associated with the command by analyzing a type of the command, and the charge pump provides a first amount of electrical energy greater than the amount of electrical energy currently required when the analysis indicates that the type of the command is different from a type of a command currently executed and the type of the command requires a greater amount of electrical energy than that required by the type of the command currently executed.

In some embodiments, the charge pump circuit includes a plurality of charge pumps. The control device increases the quantity of enabled charge pumps among the charge pumps, and the enabled charge pumps provides the first amount of electrical energy greater than the amount of electrical energy currently required.

In some embodiments, the control device is further configured to derive the information associated with the command by analyzing a type of the command, and the charge pump circuit provides a second amount of electrical energy less than the amount of electrical energy currently required when the analysis indicates that the type of the command is different from a type of a command currently executed and the type of the command requires a smaller amount of electrical energy than that required by the type of the command currently executed.

In some embodiments, the charge pump circuit includes a plurality of charge pumps. The control device decreases the quantity of enabled charge pumps among the charge pumps, and the enabled charge pumps provide the second amount of electrical energy less than the amount of electrical energy currently required.

In some embodiments, the control device derives the information associated with the command by monitoring a ratio of command occupancy in a queue, and the charge pump circuit provides a same amount of electrical energy as the amount of electrical energy currently required when the monitor result indicates that the ratio of command occupancy is less than a highest endpoint of a ratio range and greater than a lowest endpoint of the ratio range.

In some embodiments, the charge pump circuit includes a plurality of charge pumps. The control device keeps the quantity of enabled charge pumps among the charge pumps the same as that currently required, and the enabled charge pumps provides the same amount of electrical energy as the amount of electrical energy currently provided.

In some embodiments, the control device derives the information associated with the command by monitoring a ratio of command occupancy in a queue, and the charge pump circuit provides a first amount of electrical energy greater than an amount of electrical energy currently required when the monitor result indicates that the ratio of command occupancy is greater than a highest endpoint of a ratio range.

In some embodiments, the charge pump circuit includes a plurality of charge pumps.

In some embodiments, the control device increases the quantity of enabled charge pumps among the charge pumps, and the enabled charge pumps provides the first amount of electrical energy greater than the amount of electrical energy currently required.

In some embodiments, the control device derives the information associated with the command by monitoring a ratio of command occupancy in a queue, and the charge pump circuit provides a second amount of electrical energy less than an amount of electrical energy currently required when the monitor result indicates that the ratio of command occupancy is less than a lowest endpoint of a ratio range.

In some embodiments, the charge pump circuit includes a plurality of charge pumps. The control device decreasing the quantity of enabled charge pumps among the charge pumps, and the enabled charge pumps provides the second amount of electrical energy less than the amount of electrical energy currently required.

Another aspect of the present disclosure provides a method. The method includes deriving an information associated with a command; determining, based on the information, whether to provide an amount of electrical energy greater than, less than, or equal to an amount of electrical energy currently required; and providing the resultant amount of electrical energy based on the determination.

In some embodiments, the deriving information associated with the command includes analyzing a type of the command. The providing the resultant amount of electrical energy based on the determination includes providing a first amount of electrical energy greater than the amount of electrical energy currently required when the analysis indicates that the type of the command is different from a type of a command currently executed and the type of the command requires a greater amount of electrical energy than that required by the type of the command currently executed.

In some embodiments, the deriving information associated with the command includes analyzing a type of the command. The providing the resultant amount of electrical energy based on the determination includes providing a second amount of electrical energy less than the amount of electrical energy currently required when the analysis indicates that the type of the command is different from a type of a command currently executed and the type of the command requires a smaller amount of electrical energy than that required by the type of the command currently executed.

In some embodiments, the deriving the information associated with the command includes monitoring a ratio of command occupancy in a queue. The providing the resultant amount of electrical energy based on the determination includes providing a first amount of electrical energy greater than an amount of electrical energy currently required when the monitor result indicates that the ratio of command occupancy is greater than a highest endpoint of a ratio range.

In some embodiments, the deriving the information associated with the command includes monitoring a ratio of command occupancy in a queue. The providing the resultant amount of electrical energy based on the determination includes providing a second amount of electrical energy less than an amount of electrical energy currently required when the monitor result indicates that the ratio of command occupancy is less than a lowest endpoint of a ratio range.

In the present disclosure, the control device functions to derive information associated with the command. Moreover, the control device functions to determine, based on the information, whether to provide an amount of electrical energy greater than, less than, or equal to an amount of electrical energy currently required. That is, the control device is able to individually operate the first charge pump and the second charge pump in different manners. As such, an amount of electrical energy provided by the charge pump circuit is adjustable and therefore can be managed. As a result, the DRAM is able to provide a function of power management, and usage of electrical energy is relatively efficient.

In contrast, in a comparative DRAM, an enable device of the DRAM is only able to operate all charge pumps of the DRAM in the same manner. For example, when the enable device enables all the charge pumps, all the charge pumps are enabled and none of the charge pumps is disabled. Such disadvantage may result from the limitation of the simple design of the enable device. In further detail, the enable device is unable to analyze information associated with a command received. Therefore, the enable device is forced to operate all the charge pumps in the same manner. As such, an amount of electrical energy provided by all the charge pumps is non-adjustable and therefore cannot be managed. As a result, the DRAM is unable to provide a function of power management, and usage of electrical energy is relatively inefficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIG. 10 is a schematic diagram of a queue, in accordance with some embodiments of the present disclosure.

FIG. 11 is a schematic diagram illustrating an operation of the queue shown in FIG. 10, in accordance with some embodiments of the present disclosure.

FIG. 12 is a schematic diagram illustrating another operation of the queue shown in FIG. 10, in accordance with some embodiments of the present disclosure.

FIG. 13 is a schematic diagram illustrating further another operation of the queue shown in FIG. 10, in accordance with some embodiments of the present disclosure.

DETAILED DESCRIPTION

Figure 1:
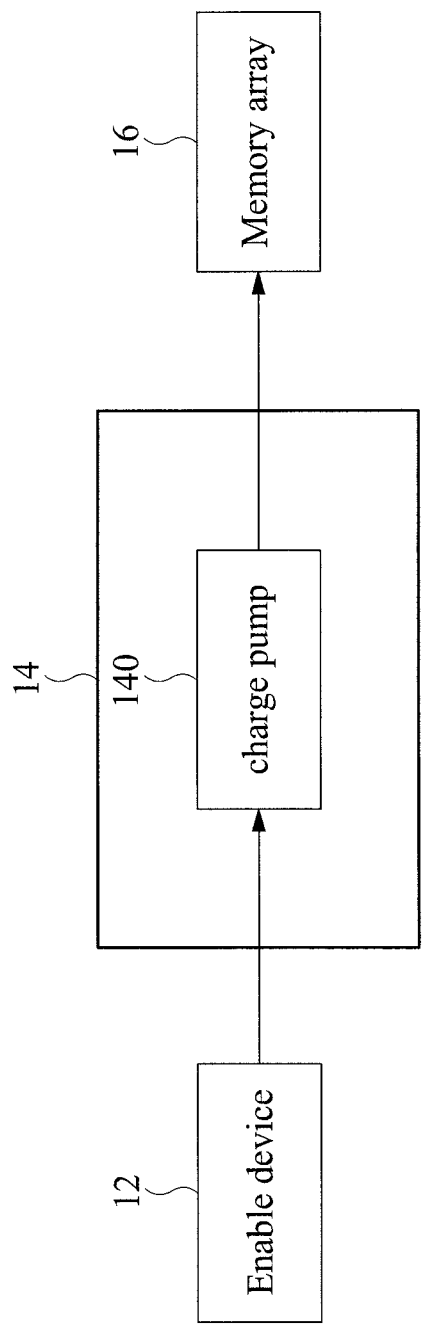
FIG. 1 is a schematic diagram of a comparative dynamic random access memory (DRAM), which includes a fuse-blowing system.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a comparative dynamic random access memory (DRAM) 10. Referring to FIG. 1, the DRAM 10 includes an enable device 12, a charge pump circuit 14 including a charge pump 140, and a memory array 16 of memory cells.

The charge pump 140 functions to provide the memory array 16 with an electrical energy sufficient to allow the memory array 16 to work. Although the charge pump 140 is depicted as a single device for convenience of discussion, the charge pump 140 may represent a plurality of charge pumps in the charge pump circuit 14.

The enable device 12 is only able to operate all the charge pumps represented by the charge pump 140 in the same manner. In other words, the enable device 12 is unable to individually operate the charge pumps in different manners. For example, when the enable device 12 enables all the charge pumps, all the charge pumps are enabled and none of the charge pumps is disabled. Such disadvantage may result from the limitation of the simple design of the enable device 12. In further detail, the enable device 12 is unable to analyze information associated with a command received. For example, the enable device 12 is unable to determine, based on a type of the command, the quantity of enabled charge pumps required. Therefore, the enable device 12 is forced to operate all the charge pumps in the same manner. As such, an amount of electrical energy provided by all the charge pumps is non-adjustable and therefore cannot be managed. As a result, the DRAM 10 is unable to provide a function of power management, and usage of electrical energy is relatively inefficient.

Figure 2:
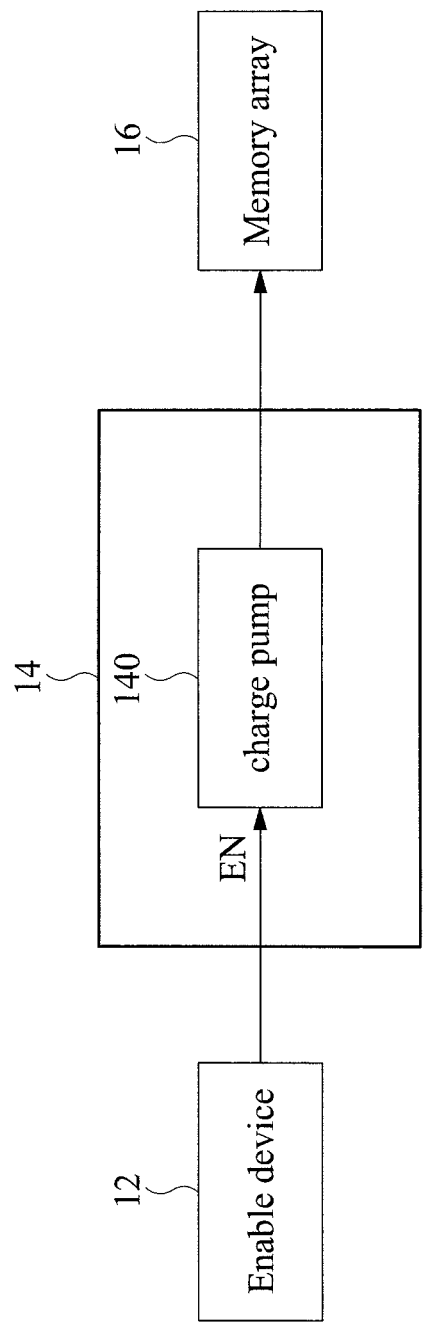
FIG. 2 is a schematic diagram illustrating an operation of the DRAM shown in FIG. 1.

FIG. 2 is a schematic diagram illustrating an operation of the DRAM 10 shown in FIG. 1. Referring to FIG. 1, the enable device 12 enables all the charge pumps, in response to a command, by, for example, providing all the charge pumps with an enable signal EN. The command is not limited to any specific command except for a command associated with, for example, a power saving operation. For example, the command includes commands instructing the memory array 16 to execute various operations, for example, a read operation, a write operation, a burst read operation, a burst write operation, and a standby operation. As such, all the charge pumps are enabled and in combination provide the memory array 16 with electrical energy.

Figure 3:
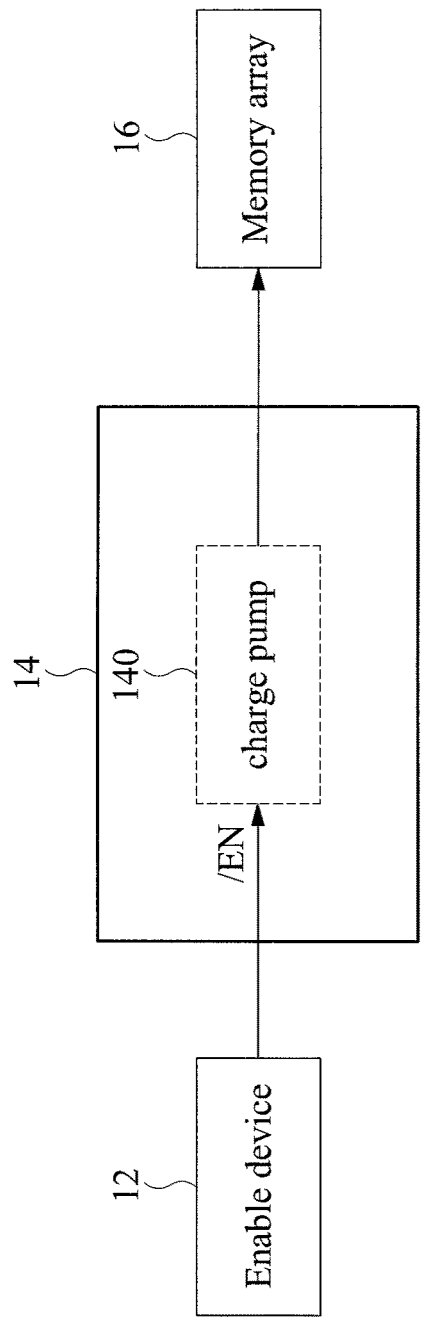
FIG. 3 is a schematic diagram illustrating another operation of the DRAM shown in FIG. 1.

FIG. 3 is a schematic diagram illustrating another operation of the DRAM 10 shown in FIG. 1. Referring to FIG. 3, the enable device 12 disables all the charge pumps in response to another command instructing the memory array 16 to execute, for example, a power saving operation by providing all the charge pumps with a disable signal /EN. As such, all the charge pumps are disabled.

As discussed in the embodiment of FIGS. 2 and 3, since the enable device 12 is only able to operate all the charge pumps represented by the charge pump 140 in the same manner, the DRAM 10 is unable to provide a function of power management, and usage of electrical energy is relatively inefficient.

Figure 4:
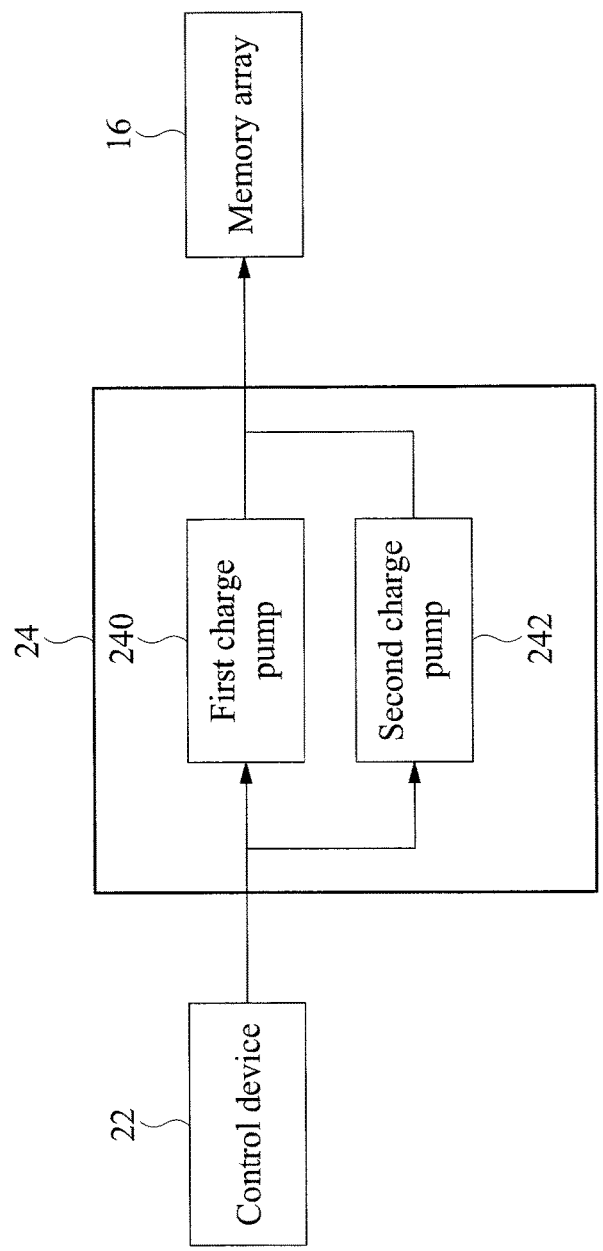
FIG. 4 is a schematic diagram of a dynamic random access memory (DRAM), in accordance with some embodiments of the present disclosure.

FIG. 4 is a schematic diagram of a dynamic random access memory (DRAM) 20, in accordance with some embodiments of the present disclosure. Referring to FIG. 4, the DRAM 20 is similar to the DRAM 10 described and illustrated with reference to FIG. 1 except that, for example, the DRAM 20 includes a control device 22, and a charge pump circuit 24 including a first charge pump 240 and a second charge pump 242.

The control device 22 functions to receive a command and derive information associated with the command. Moreover, the control device 22 functions to determine, based on the information, whether to provide an amount of electrical energy greater than, less than, or equal to an amount of electrical energy currently required, as will be described in detail below. That is, the control device 22 is able to individually operate the first charge pump 240 and the second charge pump 242 in different manners. For example, the control device 22 is able to enable the first charge pump 240 while disabling the second charge pump 242. As such, an amount of electrical energy provided by the charge pump circuit 24 is adjustable and therefore can be managed.

As a result, the DRAM 20 is able to provide a function of power management, and usage of electrical energy is relatively efficient. In the present embodiment, the control device 22 is a device within the DRAM 20; however, the present disclosure is not limited thereto. In another embodiment, the control device 22 is a processor of a DRAM controller external to the DRAM 20. In some embodiments, the control device 22 is a combinational logic.

The charge pump circuit 24 functions to provide the resultant amount of electrical energy based on the determination from the control device 22. In an embodiment, the first charge pump 240 and the second charge pump 242 are independent of each other.

Figure 5:
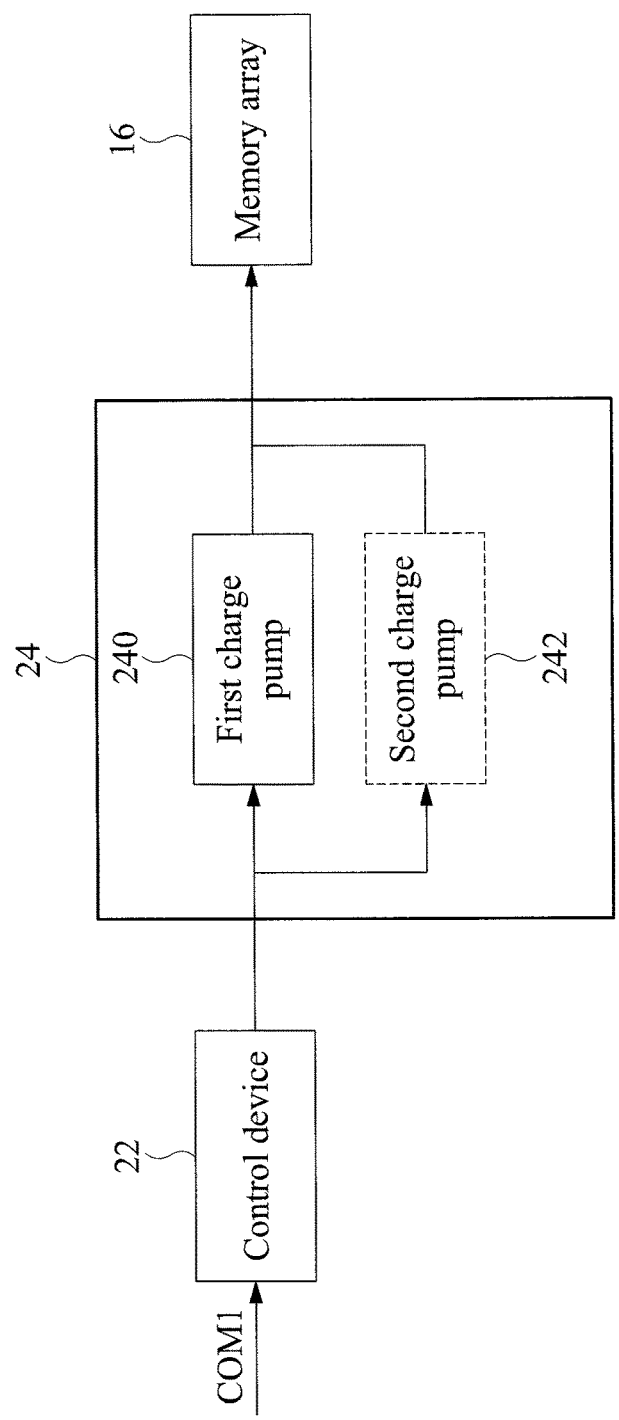
FIG. 5 is a schematic diagram illustrating an operation of the DRAM shown in FIG. 4, in accordance with some embodiments of the present disclosure.

FIG. 5 is a schematic diagram illustrating an operation of the DRAM 20 shown in FIG. 4, in accordance with some embodiments of the present disclosure. To facilitate a better understanding of the operation of the DRAM 20, in the embodiments of FIGS. 5 to 7, it is assumed that the first charge pump 240 is currently enabled and the second charge pump 242 is currently disabled. In such case, an amount of electrical energy provided by only the first charge pump 240 is sufficient to allow the memory array 16 to function in some specific operations, for example, a standby operation.

In operation, the control device 22 derives information associated with a command. Based on the information, the control device 22 determines to provide an amount of electrical energy equal to an amount of electrical energy currently required. As a result, the control device 22 continues to enable the first charge pump 240 and disable the second charge pump 242 as shown in FIG. 5. Only the first charge pump 240 will provide the memory array 16 with the resultant amount of electrical energy.

Figure 6:
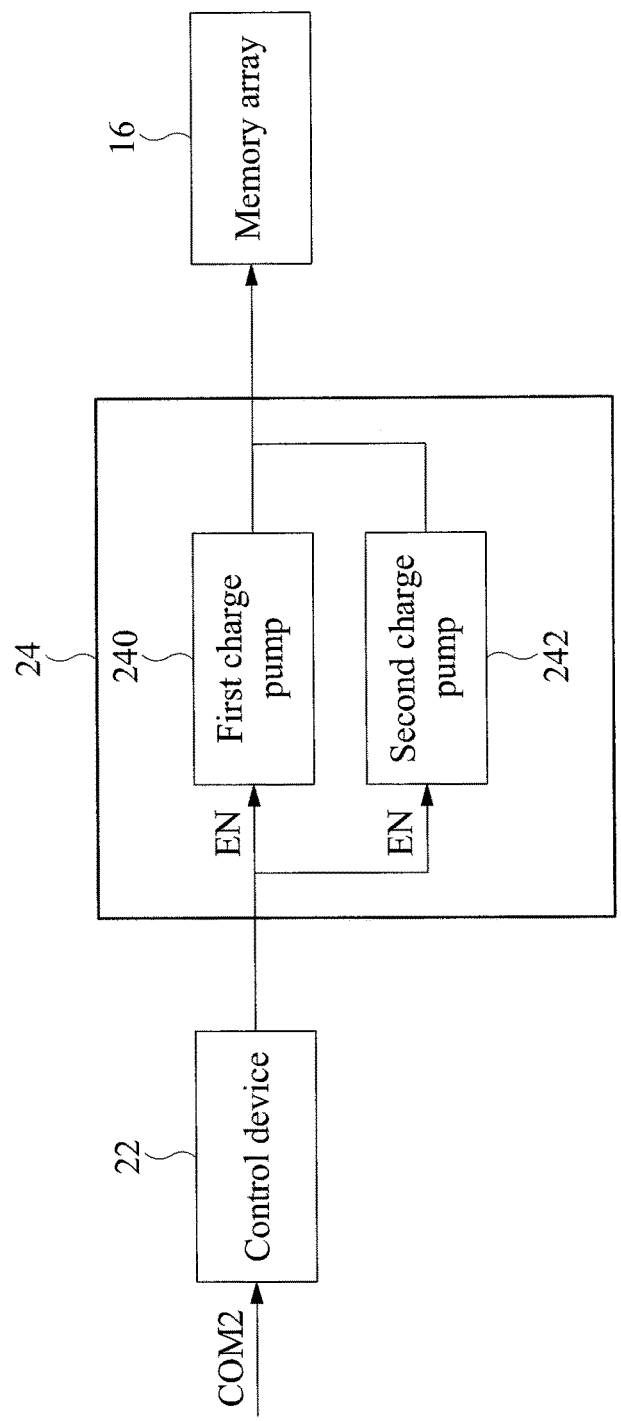
FIG. 6 is a schematic diagram illustrating another operation of the DRAM shown in FIG. 4, in accordance with some embodiments of the present disclosure.

FIG. 6 is a schematic diagram illustrating another operation of the DRAM 20 shown in FIG. 4, in accordance with some embodiments of the present disclosure. Following the assumption stated in the embodiment of FIG. 5, and in contrast to the determination of the control device 22 in the embodiment of FIG. 5, the control device 22 determines, based on the information, to provide an amount of electrical energy greater than an amount of electrical energy currently required. As a result, the control device 22 increases the quantity of enabled charge pumps by enabling both the first charge pump 240 and the second charge pump 242 as shown in FIG. 6. The first charge pump 240 and the second charge pump 242 will in combination provide the memory array 16 with the resultant amount of electrical energy.

Figure 7:
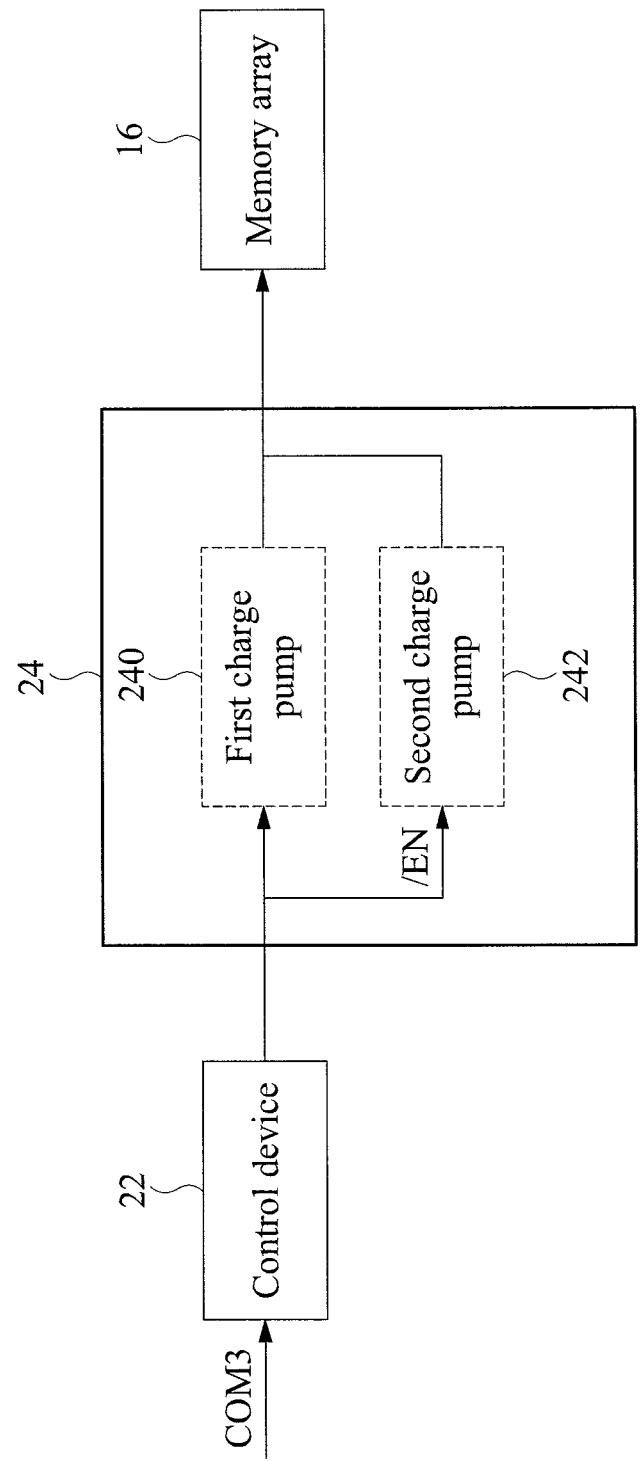
FIG. 7 is a schematic diagram illustrating yet another operation of the DRAM shown in FIG. 4, in accordance with some embodiments of the present disclosure.

FIG. 7 is a schematic diagram illustrating yet another operation of the DRAM 20 shown in FIG. 4, in accordance with some embodiments of the present disclosure. Following the assumption stated in the embodiment of FIG. 5, and in contrast to the determinations of the control devices in the embodiments of FIGS. 5 and 6, the control device 22 determines, based on the information, to provide an amount of electrical energy less than an amount of electrical energy currently required. As a result, the control device 22 decreases the quantity of enabled charge pumps by disabling the second charge pump 242, and causes the first charge pump 240 provides a minimal voltage sufficient to allow the memory array 16 to work in a normal operation.

Figure 8:
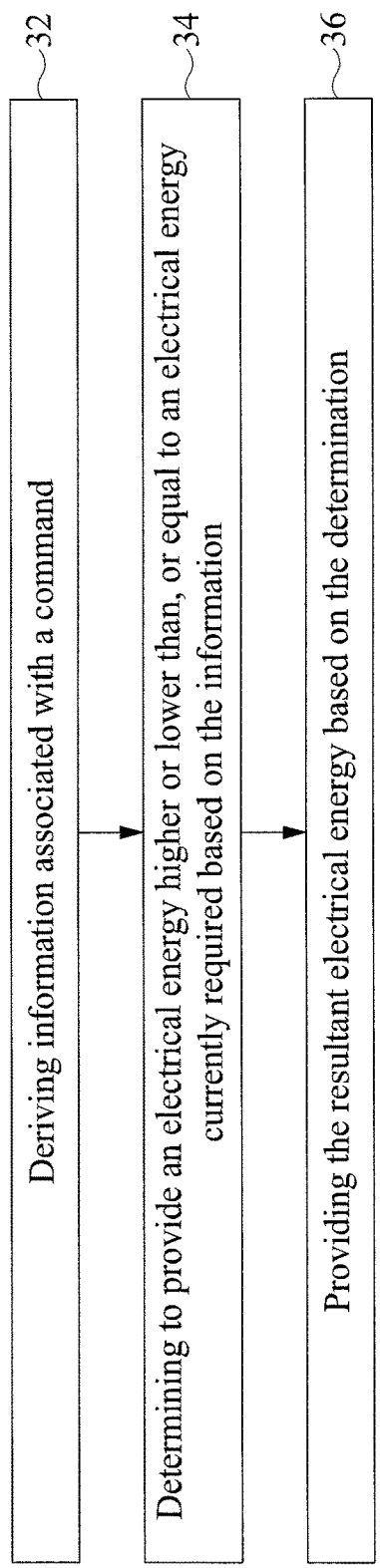
FIG. 8 is a flow diagram illustrating a method of operating a DRAM, in accordance with some embodiments of the present disclosure.

FIG. 8 is a flow diagram illustrating a method 30 of operating a DRAM in accordance with some embodiments of the present disclosure. Referring to FIG. 8, the method 30 includes operations 32, 34 and 36. The method 30 begins with operation 32, in which information associated with a command is derived. The method 30 continues with operation 34, in which it is determined, based on the information, whether to provide an amount of electrical energy greater than, less than, or equal to an amount of electrical energy currently required. Subsequent to operation 34, in operation 36, the resultant amount of electrical energy is provided based on the determination.

Figure 9:
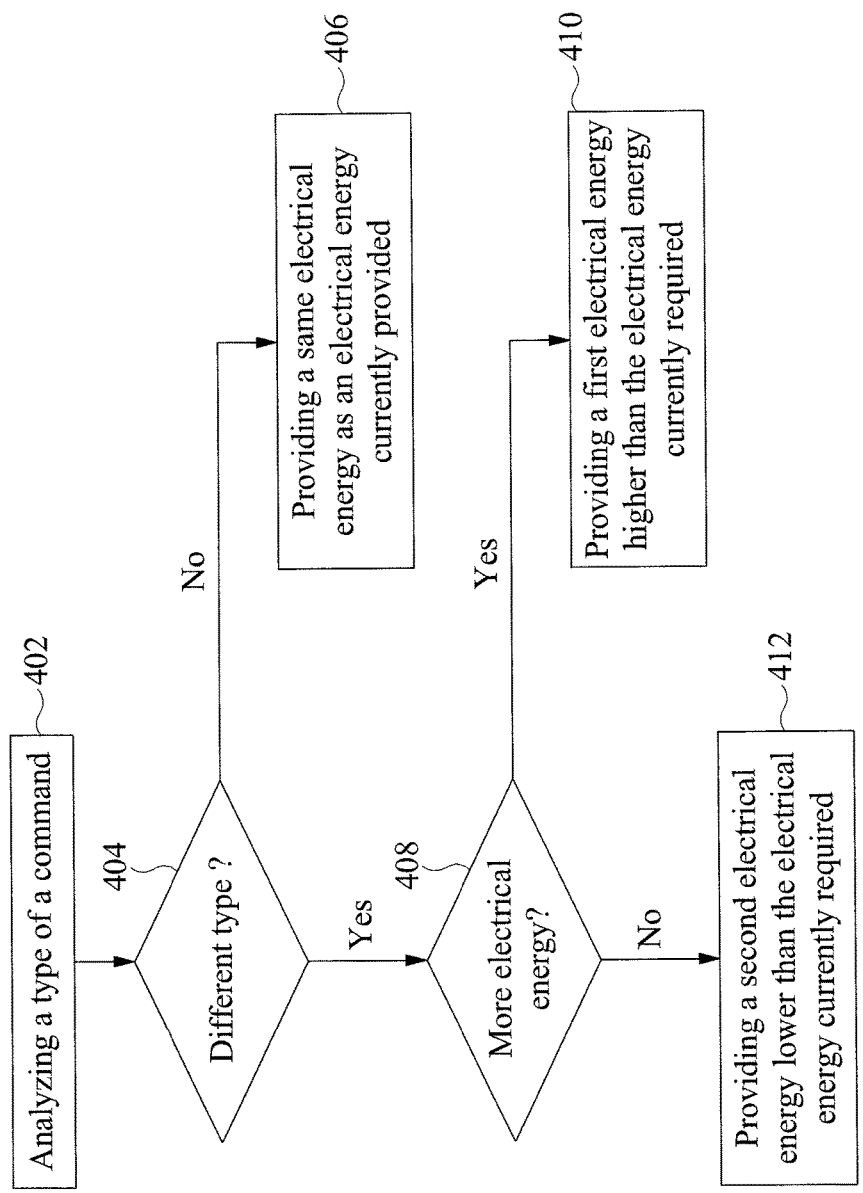
FIG. 9 is a flow diagram illustrating another method of operating a DRAM, in accordance with some embodiments of the present disclosure.

FIG. 9 is a flow diagram illustrating another method 40 of operating a DRAM, in accordance with some embodiments of the present disclosure. The method 40 includes operations 402, 404, 406, 408, 410 and 412.

To facilitate a better understanding of method 40, in the embodiments of FIGS. 5 to 7, the present embodiment will be discussed accompanied with FIGS. 5 to 7. Moreover, it is assumed that the memory array 16 currently operates at, for example, a standby operation. Accordingly, the control device 22 enables only the first charge pump 240. An amount of electrical energy provided by only the enabled first charge pump 240 without the second charge pump 242 is sufficient to allow the memory array 16 to operate at the standby operation.

The method 40 begins with operation 402, in which a type of a command is analyzed. The method proceeds to operation 404, in which the analysis indicates whether the type of a command is different from a type of a command currently executed.

If negative, the method 40 proceeds to operation 406, in which a same amount of electrical energy as an amount of electrical energy currently required is provided. Referring to FIG. 5, in the embodiment of FIG. 5, the control device 22 receives a first type COM1 of a command instructing the memory array 16 to operate at a standby operation, and analyzes the first type COM1 of a command. Since the types of the commands currently received and currently executed are not different, the control device 22 continues to enable the first charge pump 240 and disable the second charge pump 242. As such, the charge pump circuit 24 continues to provide a same amount of electrical energy as an amount of electrical energy currently required. The quantity of the charge pumps mentioned above only serves as an example, and the above statement intends to express that the same amount of electrical energy as the amount of electrical energy currently provided is provided by keeping the quantity of enabled charge pumps the same as that currently required.

If affirmative, the method 40 proceeds to operation 408, in which the analysis indicates whether the type of a command requires a greater amount of electrical energy than the amount of electrical energy required by a type of a command currently executed. If affirmative, the method 40 proceeds to operation 410. Referring to FIG. 6, in the embodiment of FIG. 6, the control device 22 receives a second type COM2 of a command instructing the memory array 16 to execute an operation, such as a read operation, a write operation, a burst read operation or a burst write operation, which requires a relatively high amount of electrical energy, and analyze the second type COM2 of a command. Since the types of the commands currently received and currently executed are different, and the type of a command currently received requires a greater amount of electrical energy than that required by the type of a command currently executed, the charge pump circuit 24 provides a first amount of electrical energy greater than the amount of electrical energy currently required. In an embodiment, the control device 22 causes the charge pump circuit 24 to provide the first amount of electrical energy by enabling both the first charge pump 240 and the second charge pump 242. The quantity of the charge pumps only serves as an example, and the above statement intends to express that the first amount of electrical energy greater than the amount of electrical energy currently required is provided by increasing the quantity of enabled charge pumps.

If affirmative, the method 40 proceeds to operation 412, in which a second amount of electrical energy less than the amount of electrical energy currently required is provided. Referring to FIG. 7, in the embodiment of FIG. 6, the control device 22 receives a third type is COM3 of a command instructing the memory array 16 to execute an operation, such as a power saving operation, which requires a relatively low amount of electrical energy, and analyze the third type COM3 of a command. Since the types of the commands currently received and currently executed are different, and the type of the command currently received requires a smaller amount of electrical energy than that required by the type of a command currently executed, the charge pump circuit 24 provides a second amount of electrical energy less than the amount of electrical energy currently required by, for example, disabling the second charge pump 242 with a disable signal /EN, and causes the first charge pump 240 provides a minimal voltage sufficient to allow the memory array 16 to work, for example, in a power saving mode. The quantity of the charge pumps only serves as an example, and the above statement intends to express that the second amount of electrical energy less than the amount of electrical energy currently required is provided by decreasing the quantity of enabled charge pumps.

FIG. 10 is a schematic diagram of a queue 50, in accordance with some embodiments of the present disclosure. Referring to FIG. 10, the queue 50 provides five fields to contain commands. The quantity of fields in the queue 50 serves as an example, and the present disclosure is not limited thereto.

FIG. 11 is a schematic diagram illustrating an operation of the queue 50 shown in FIG. 10, in accordance with some embodiments of the present disclosure. Referring to FIG. 11, one of the five fields is occupied by one command COM. A ratio of command occupancy can be expressed as (1/5). Such ratio only serves as an example.

FIG. 12 is a schematic diagram illustrating another operation of the queue 50 shown in FIG. 10, in accordance with some embodiments of the present disclosure. Referring to FIG. 12, three of the five fields are occupied by three commands COM. A ratio of command occupancy can be expressed as (3/5). Such ratio only serves as an example. Moreover, a point 52 and a point 54 together define a ratio range therebetween. The point 52 can be deemed as a lowest endpoint of the ratio range, and the point 54 can be deemed as a highest endpoint of the ratio range.

FIG. 13 is a schematic diagram illustrating further another operation of the queue 50 shown in FIG. 10, in accordance with some embodiments of the present disclosure. Referring to FIG. 13, five fields are occupied by five commands COM. A ratio of command occupancy can be expressed as (5/5). Such ratio only serves as an example.

The ratio can reflect whether a DRAM is busy. A larger ratio indicates the DRAM is busier. Generally, when the DRAM is relatively busy, the DRAM requires a relatively greater amount of electrical energy. When the ratio is less than the lowest endpoint 52, the DRAM can be deemed as being not busy. When the ratio is greater than the highest endpoint 54, the DRAM can be deemed as being quite busy. When the ratio is within the range, the DRAM can be deemed as being in the normal-load working state.

Figure 14:
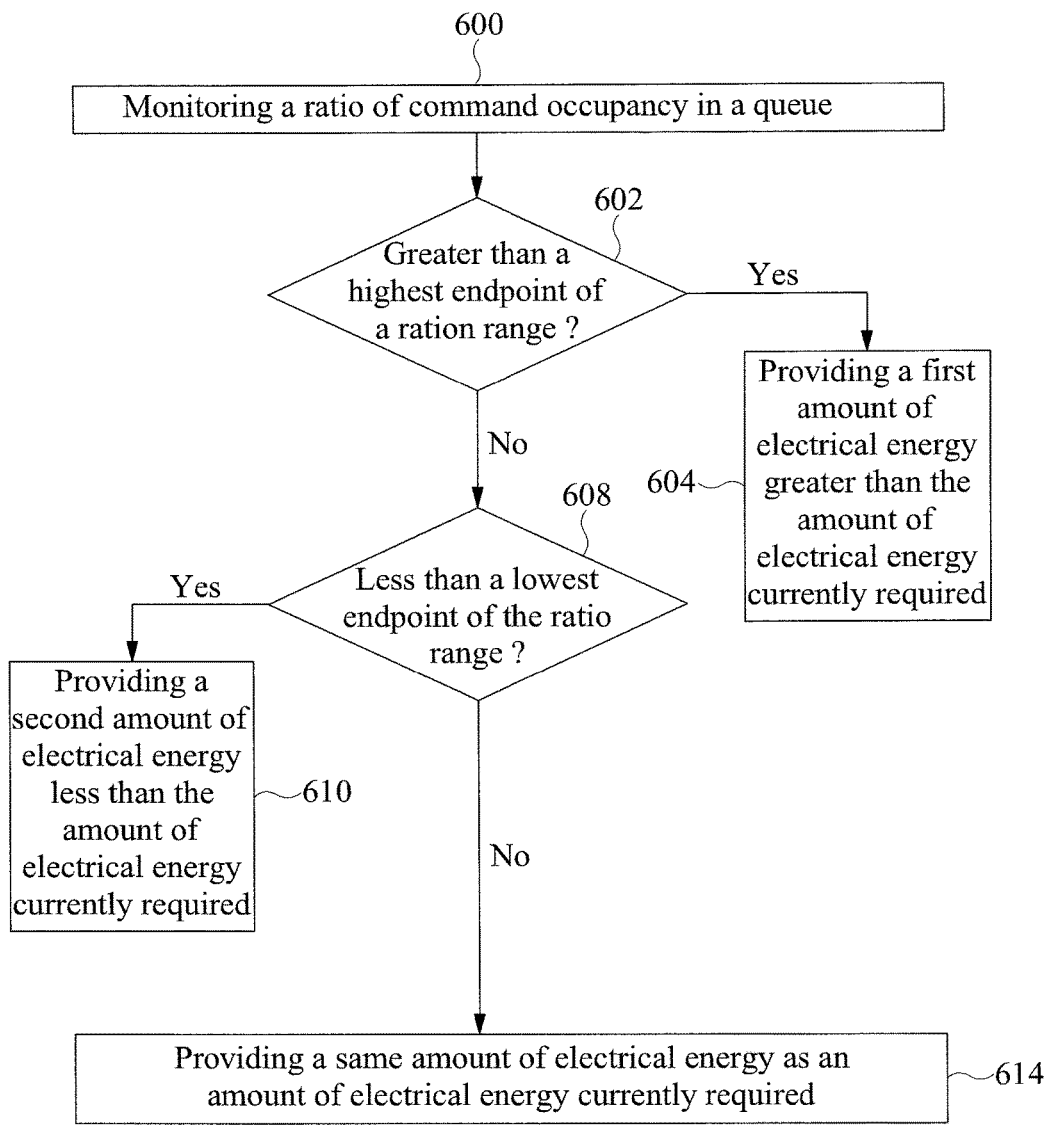
FIG. 14 is a flow diagram illustrating further another method of operating a DRAM, in accordance with some embodiments of the present disclosure.

FIG. 14 is a flow diagram illustrating further another method 60 of operating a DRAM in accordance with some embodiments of the present disclosure. The embodiment of FIG. 14 will be discussed accompanied with FIGS. 2 and 10 to 13. Referring to FIG. 14, the method 60 includes operations 600, 602, 604, 608, 610 and 614.

The method 60 begins with operation 600, in which the control device 22 monitors a ratio of command occupancy in a queue 50. The method 60 proceeds to operation 602, in which the monitor result indicates whether the ratio is greater than the highest endpoint 54 of the ration range defined by the highest endpoint 54 and the lowest endpoint 52.

If affirmative, for example the ratio is (5/5) and the highest point 54 is (3/5), the method 60 proceeds to operation 604, in which the charge pump circuit 24 provides a first amount of electrical energy greater than an amount of electrical energy currently required. In an embodiment, the control device 22 increases the quantity of enabled charge pumps in the charge pump circuit 24, such that the charge pump circuit 24 provides the first amount of electrical energy.

If negative, the method 60 proceeds to operation 608, in which the monitor result indicates whether the ratio is less than the lowest endpoint 52 of the ratio range.

If affirmative, for example, the ratio is (0/5) and the lowest point 52 is (1/5), the charge pump circuit 24 provides a second amount of electrical energy less than the amount of electrical energy currently required. In an embodiment, the control device 22 decreases the quantity of enabled charge pumps in the charge pump circuit 24, such that the charge pump circuit 24 provides the second amount of electrical energy.

If negative, for example, the ratio is (2/5) and the lowest point 52 is (1/5), the charge pump circuit 24 provides a same amount of electrical energy as the amount of electrical energy currently required. In an embodiment, the control device 22 keeps the quantity of enabled charge pumps the same as that currently required, such that the charge pump circuit 24 provides the same amount of electrical energy.

In the present embodiment, operation 602 is performed prior to operation 608. However, the present disclosure is not limited thereto. Operations 602 and 608 are interchangeable in order. When operations 608 and 608 are interchanged, the associated operations in order are also correspondingly interchanged.

In the present embodiment, a non-transitory computer readable storage medium storing one or more programs can be provided. The one or more programs comprise instructions, which, when executed by a computing device, cause the computing device to perform the operations mentioned in the present disclosure.

In the present disclosure, the control device 22 functions to derive information associated with the command. Moreover, the control device 22 functions to determine, based on the information, whether to provide an amount of electrical energy greater than, less than, or equal to an amount of electrical energy currently required. That is, the control device 22 is able to individually operate the first charge pump 240 and the second charge pump 242 in different manners. As such, an amount of electrical energy provided by the charge pump circuit 24 is adjustable and therefore can be managed. As a result, the DRAM 20 is able to provide a function of power management, and usage of electrical energy is relatively efficient.

In contrast, in a comparative DRAM 10, the enable device 12 is only able to operate all the charge pumps of the DRAM 10 in the same manner. For example, when the enable device 12 enables all the charge pumps, all the charge pumps are enabled and none of the charge pumps is disabled. Such disadvantages may result from the limitation of the simple design of the enable device 12. In further detail, the enable device 12 is unable to analyze information associated with a command received. Therefore, the enable device 12 is forced to operate all the charge pumps in the same manner. As such, an amount of electrical energy provided by all the charge pumps is non-adjustable and therefore cannot be managed. As a result, the DRAM 10 is unable to provide a function of power management, and usage of electrical energy is relatively inefficient.

One aspect of the present disclosure provides a DRAM. The DRAM includes a memory array of memory cells, a control device and a charge pump circuit. The control device derives an information associated with a command, and determine, based on the information, whether to provide an amount of electrical energy greater than, less than, or equal to an amount of electrical energy currently required. The charge pump circuit provides the memory array with the resultant amount of electrical energy based on the determination.

Another aspect of the present disclosure provides a method. The method includes deriving an information associated with a command; determining whether to provide, based on the information, an amount of electrical energy greater than, less than, or equal to an amount of electrical energy currently required; and providing the resultant amount of electrical energy based on the determination.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic access memory (DRAM), comprising:
a memory array of memory cells;
a control device configured to derive an information associated with a command, and determine, based on the information, whether to provide an amount of electrical energy greater than, less than, or equal to an amount of electrical energy currently required; and
a charge pump circuit configured to provide the memory array with the resultant amount of electrical energy based on the determination,
wherein the control device derives the information associated with the command by monitoring a ratio of command occupancy in a queue, and the charge pump circuit provides a same amount of electrical energy as the amount of electrical energy currently required when the monitor result indicates that the ratio of command occupancy is less than a highest endpoint of a ratio range and greater than a lowest endpoint of the ratio range.

2. The DRAM of claim 1, wherein the charge pump circuit includes a plurality of charge pumps,
wherein the control device keeps the quantity of enabled charge pumps among the charge pumps the same as that currently required, and the enabled charge pumps provides the same amount of electrical energy as the amount of electrical energy currently provided.

3. A dynamic access memory (DRAM) comprising:
a memory array of memory cells:
a control device configured to derive an information associated with a command, and determine, based on the information, whether to provide an amount of electrical energy greater than, less than, or equal to an amount of electrical energy currently required; and
a charge pump circuit configured to provide the memory array with the resultant amount of electrical energy based on the determination,
wherein the control device derives the information associated with the command by monitoring a ratio of command occupancy in a queue, and the charge pump circuit provides a first amount of electrical energy greater than an amount of electrical energy currently required when the monitor result indicates that the ratio of command occupancy is greater than a highest endpoint of a ratio range.

4. The DRAM of claim 3, wherein the charge pump circuit includes a plurality of charge pumps,
wherein the control device increases the quantity of enabled charge pumps among the charge pumps, and the enabled charge pumps provides the first amount of electrical energy greater than the amount of electrical energy currently required.

5. A dynamic access memory (DRAM), comprising:
a memory array of memory cells;
a control device configured to derive an information associated with a command, and determine based on the information, whether to provide an amount of electrical energy greater than, less than, or equal to an amount of electrical energy currently required; and
a charge pump circuit configured to provide the memory array with the resultant amount of electrical energy based on the determination,
wherein the control device derives the information associated with the command by monitoring a ratio of command occupancy in a queue, and the charge pump circuit provides a second amount of electrical energy less than an amount of electrical energy currently required when the monitor result indicates that the ratio of command occupancy is less than a lowest endpoint of a ratio range.

6. The DRAM of claim 5, wherein the charge pump circuit includes a plurality of charge pumps,
wherein the control device decreasing the quantity of enabled charge pumps among the charge pumps, and the enabled charge pumps provides the second amount of electrical energy less than the amount of electrical energy currently required.

7. A method, comprising:
deriving an information associated with a command;
determining, based on the information, whether to provide an amount of electrical energy greater than, less than, or equal to an amount of electrical energy currently required; and
providing the resultant amount of electrical energy based on the determination,
wherein the deriving the information associated with the command includes:
monitoring a ratio of command occupancy in a queue, and
wherein the providing the resultant amount of electrical energy based on the determination includes:
providing a first amount of electrical energy greater than an amount of electrical energy currently required when the monitor result indicates that the ratio of command occupancy is greater than a highest endpoint of a ratio range.

8. A method, comprising:
deriving an information associated with a command;
determining, based on the information, whether to provide an amount of electrical energy greater than, less than, or equal to an amount of electrical energy currently required; and
providing the resultant amount of electrical energy based on the determination,
wherein the deriving the information associated with the command includes:
monitoring a ratio of command occupancy in a queue, and
wherein the providing the resultant amount of electrical energy based on the determination includes:
providing a second amount of electrical energy less than an amount of electrical energy currently required when the monitor result indicates that the ratio of command occupancy is less than a lowest endpoint of a ratio range.

* * * * *